(12) United States Patent
Kabir et al.

(10) Patent No.: US 8,610,467 B2
(45) Date of Patent: Dec. 17, 2013

(54) SAMPLE AND HOLD CIRCUIT

(75) Inventors: Mohammad Nizam U. Kabir, Tempe, AZ (US); Douglas A. Garrity, Gilbert, AZ (US); Rakesh Shiwale, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/455,400

(22) Filed: Apr. 25, 2012

(65) Prior Publication Data

US 2013/0285705 A1    Oct. 31, 2013

(51) Int. Cl.
*H03K 5/00* (2006.01)
(52) U.S. Cl.
USPC .................................. 327/94; 327/95; 327/96
(58) Field of Classification Search
USPC .............................. 327/94, 95, 96, 91, 93, 198
See application file for complete search history.

(56) References Cited

U.S. PATENT DOCUMENTS

| | | | | |
|---|---|---|---|---|
| 4,574,250 A | * | 3/1986 | Senderowicz | 330/258 |
| 4,893,088 A | * | 1/1990 | Myers et al. | 327/336 |
| 5,363,055 A | * | 11/1994 | Ribner | 330/9 |
| 6,169,427 B1 | * | 1/2001 | Brandt | 327/94 |
| 6,184,726 B1 | * | 2/2001 | Haeberli et al. | 327/96 |
| 6,661,283 B1 | * | 12/2003 | Lee | 330/9 |

OTHER PUBLICATIONS

Wenhua (Will) Yang et al. A 3-V 340-mW 14-b 75-Msample/s CMOS ADC With 85-dB SFDR at Nyquist Input. 2001.
Kwang Young Kim et al. A 10-b, 100-MS/s CMOS A/D Converter. Mar. 1997.
Mikko Waltari et al. A 10-Bit 220-MSAMPLES/S CMOS Sample-and-Hold Circuit. 1998.
Mikael Gustavsson et al. Global Passive Sampling Technique for High-Speed Switched-Capacitor Time-Interleaved ADCs. Sep. 2000.
J. J. F. Rijns et al. Spectral Analysis of Double-Sampling Switched-Capacitor Filters. Nov. 1991.

* cited by examiner

*Primary Examiner* — Lincoln Donovan
*Assistant Examiner* — Jung H Kim
(74) *Attorney, Agent, or Firm* — Ingrassia Fisher & Lorenz, P.C.

(57) ABSTRACT

A sample and hold circuit is provided. The circuit includes a plurality of switches, a first capacitor, an operational amplifier having a first input selectively coupled to the first capacitor and an output, a second capacitor and a third capacitor both selectively coupled to the first capacitor and both selectively coupled between the first input of the operational amplifier and the output of the operational amplifier, wherein the plurality of switches are configured to receive a plurality of control signals such that the first capacitor is configured to sample an input signal in a sample phase and to transfer a charge to one of the second capacitor and the third capacitor in a hold phase, and the second capacitor and third capacitor are configured to alternate between holding the transferred charge and resetting in any back-to-back hold phases.

19 Claims, 3 Drawing Sheets

SAMPLE AND HOLD CIRCUIT

TECHNICAL FIELD

The following relates to circuits, and more particularly to sample and hold circuits.

BACKGROUND

Sample and hold circuits are useful tools for sampling an analog signal. Sample and hold circuits, as the name suggest, sample an input signal and hold the sampled input signal at an output of the circuit. The output of sample and hold circuits is often fed into an analog-to-digital converter which provides a digital representation of the input signal.

DESCRIPTION OF THE DRAWING FIGURES

Exemplary embodiments will hereinafter be described in conjunction with the following drawing figures, wherein like numerals denote like elements.

DETAILED DESCRIPTION

According to various exemplary embodiments, a sample and hold circuit is provided. In one embodiment, the sample and hold circuit includes an operational amplifier, three capacitors and twelve switches selectively coupling the various components. The sample and hold circuit operates in two phases. In the first phase a first capacitor samples an input analog signal while an electrically isolated second capacitor and the operational amplifier hold a voltage from a previous second phase at the output of the sample and hold circuit and a third capacitor, which is electrically isolated from the first capacitor, the second capacitor and the operational amplifier resets. In the second phase, the second capacitor is electrically isolated from the other circuit elements and resets, the first capacitor and the operational amplifier hold the voltage sampled by the first capacitor in the prior first phase at the output of the sample and hold circuit while the third capacitor samples the voltage at the output in order to hold the voltage during the subsequent first phase. Because there are never more than two capacitors coupled to the operational amplifier at any given time, the output of the operational amplifier settles faster, allowing the sample and hold circuit to be used in high speed applications.

The sample and hold circuit may be used in both sub-sampling applications and non-sub-sampling applications. In sub-sampling applications, the frequency of the analog input signal may be higher than a sampling frequency of the sample and hold circuit. When the frequency of the input voltage signal is greater than the sampling frequency of the sample and hold circuit, the sample and hold circuit generates an output signal based upon the difference in the frequencies. For example, if the analog input signal is oscillating at, for example, forty-two megahertz (MHz) and the sample and hold circuit samples the analog input signal at, for example, forty MHz, the sample and hold circuit would generate an output signal oscillating at around two MHz. The sample rate of the sample and hold circuit can vary depending upon the application. The sample and hold circuit can also be used in applications where the sampled voltage has to be held for an entire clock period. Traditional sample and hold circuits have reset periods where the output of the sample and hold circuit returns to zero. However, as discussed in further detail below, the sample and hold circuit utilizes an arrangement of capacitors to sample and hold the voltage such that the sample and hold circuit holds a voltage from a prior hold phase during a sampling phase.

Figure 1:
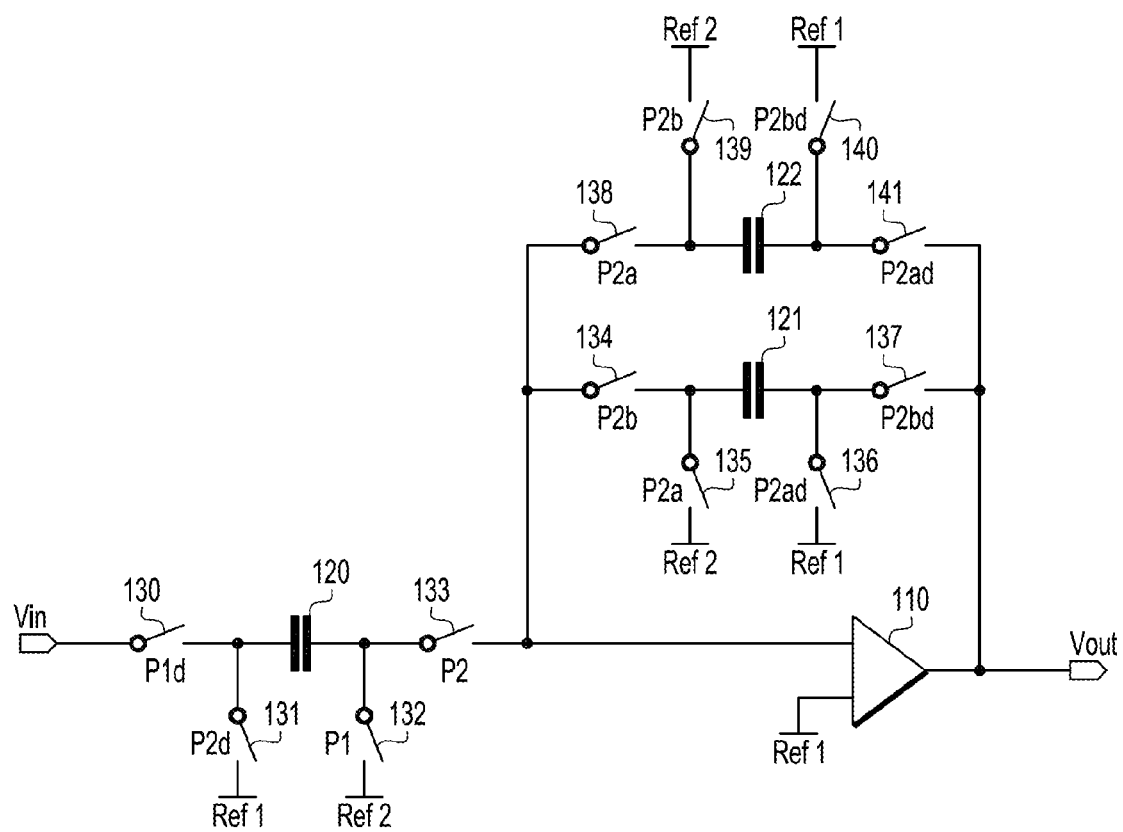
FIG. 1 is a circuit diagram of an exemplary sample and hold circuit, in accordance with an embodiment.

FIG. 1 is a circuit level diagram of an exemplary sample and hold circuit 100 (hereinafter referred to as circuit 100), in accordance with an embodiment. The circuit 100 can be used in any sample and hold application. For example, the circuit 100 can be used in conjunction with an analog-to-digital converter (ADC) to provide a digital representation of a sampled analog signal. The analog signal can be, for example, from an automotive radar application such as a crash avoidance system or an adaptive cruise control system. In other embodiments, for example, the circuit 100 may be used in other data acquisition fields, including, but not limited to, data acquisition for test automation, monitoring or control systems.

The circuit includes an operational amplifier (op amp) 110, three capacitors 120-123, and twelve switches 130-141 which selectively couple the various components together. One of ordinary skill in the art would recognize that the switches 130-141 could be implemented in a variety of ways, for example, CMOS transmission gates, MOS transistors, or any other type of switch or combination thereof. A first end of switch 130 is configured to receive an input analog signal Vin. The switch 131 is coupled between the second end of switch 130 and a first reference voltage. The capacitor 120 is also coupled to the second end of switch 130. The capacitor 120 samples the input analog signal Vin, as discussed in further detail below. The switch 132 is coupled between the second end of the capacitor 120 and a second reference voltage. The switch 133 is coupled between the second end of the capacitor 120 and a first input of the op amp 110. As discussed in further detail below, when the circuit 100 is sampling the input analog signal Vin, switches 130 and 132 will be closed and switches 131 and 133 will be open. Conversely, when the circuit is in a hold mode, switches 131 and 133 will be closed and switches 130 and 132 will be open. In one embodiment, for example, the first and second reference voltages may be substantially zero volts. In other words, the first and second reference voltages may be ground. In another embodiment, for example, one or both of the first and second reference voltages may be a connected to a powers supply (not illustrated) supplying a non-zero voltage.

As seen in FIG. 1, there are two paths between the first input of the op amp 110 and the output of the op amp 110, which is also the output Vo of the circuit 100. Each path includes four switches and a capacitor. The switches on each path are controlled such that the paths alternate between holding the sampled voltage during a hold period and resetting. In other words, the first path would hold a first sampled voltage while the second path resets. Then, during the subsequent cycle, the second path holds a second sampled voltage while the first path resets.

The first path includes a switch 134 coupled to the first input of the op amp 110. A switch 135 is coupled between the second end of switch 134 and the second reference voltage. A capacitor 121 is also coupled to the second end of switch 134. The switch 136 is coupled between the second end of capacitor 121 and the first reference voltage. The switch 137 is coupled between the second end of capacitor 121 and the output of the op amp 110.

The second path includes a switch 138 coupled to the first input of the op amp 110. A switch 139 is coupled between the second end of switch 138 and the second reference voltage. A capacitor 122 is also coupled to the second end of switch 138. The switch 140 is coupled between the second end of capacitor 122 and the first reference voltage. The switch 141 is coupled between the second end of capacitor 122 and the output of the op amp 110.

Figure 2:
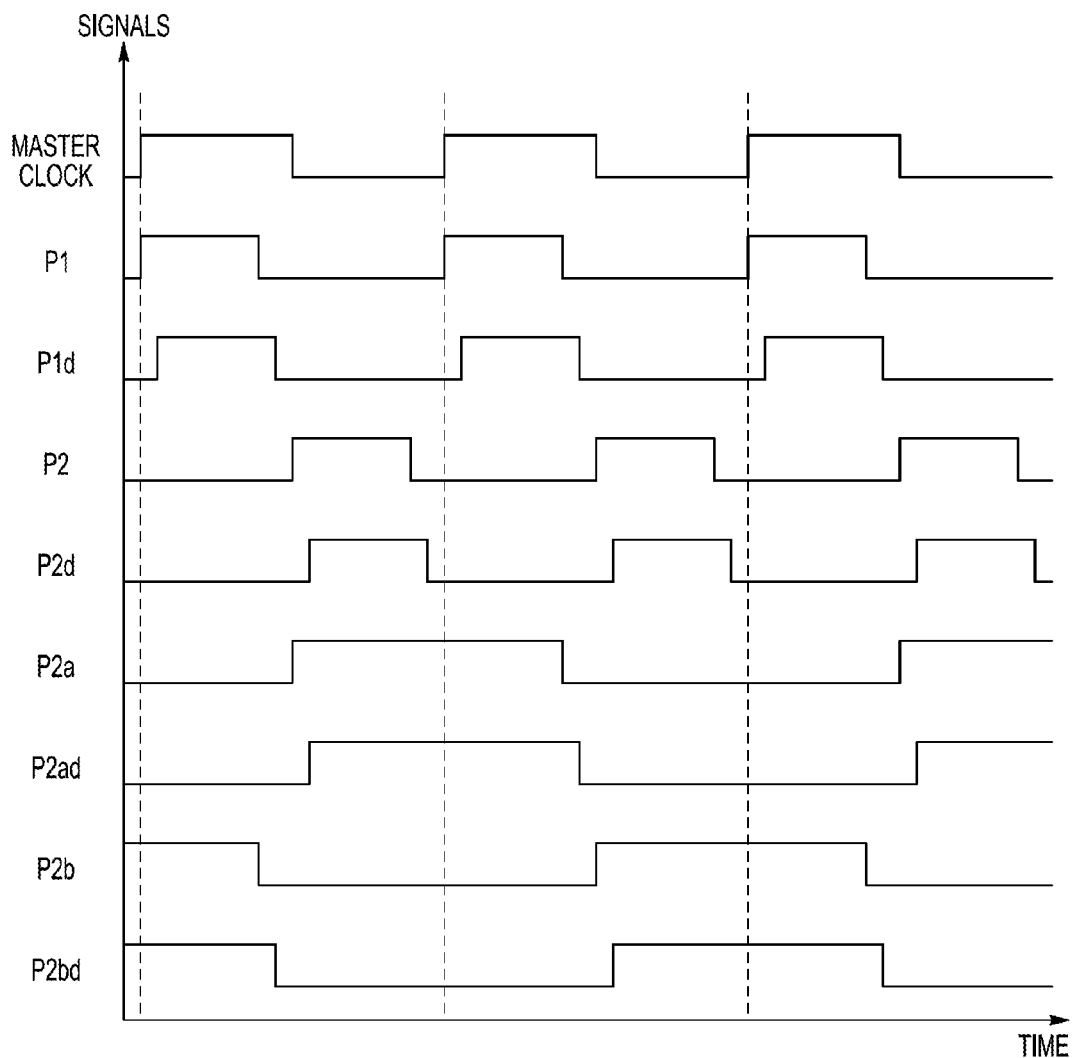
FIG. 2 is a timing diagram illustrating control signals for the sample and hold circuit illustrated in FIG. 1, in accordance with an embodiment.

The circuit 100 uses eight control signals to control switches 130-141. The control signals may be generated in any fashion. In one embodiment, for example, the control signals may be generated by one or more clock signals. The one or more clock signals may be delayed, slowed (e.g., divided by two), or a combination there of to generate the eight control signals. FIG. 2 is a timing diagram illustrating the eight control signals, in accordance with an embodiment. In this embodiment, the eight control signals P1, P1*d*, P2, P2*d*, P2*a*, P2*ad*, P2*b* and P2*bd* are generated based upon a master clock signal. As seen in FIG. 2, control signals P1*d*, P2*d*, P2*ad* and P2*bd* are delayed versions of P1, P2, P2*a* and P2*b*, respectively. The delayed versions of the signals are used to avoid signal dependency from the switches.

Returning to FIG. 1, in one embodiment switch 130 receives the control signal P1*d*, switch 131 receives the control signal P2*d*, switch 132 receives the P1 control signal, switch 133 receives the P2 control signal, switch 134 receives the P2*b* control signal, switch 135 receives the P2*a* control signal, switch 136 receives the P2*ad* control signal, switch 137 receives the P2*bd* control signal, switch 138 receives the P2*a* control signal, switch 139 receives the P2*b* control signal, switch 140 receives the P2*bd* control signal, and switch 141 receives the P2*ad* control signal. As discussed above, the first and second paths alternate between holding a sampled voltage and resetting. Accordingly, the control signals each path receives can be interchanged such that switch 134 receives the P2*a* control signal, switch 135 receives the P2*b* control signal, switch 136 receives the P2*bd* control signal, switch 137 receives the P2*ad* control signal, switch 138 receives the P2*b* control signal, switch 139 receives the P2*a* control signal, switch 140 receives the P2*ad* control signal, and switch 141 receives the P2*bd* control signal.

In a first phase, switches 130 and 132 are closed by signals P1*d* and P1, respectively, which allows the capacitor 120 to sample the input analog signal Vin. In the circuit's second phase, switches 130 and 132 are opened by signals P1*d* and P1, respectively, and switches 131 and 133 are closed by signals P2*d* and P2, respectively. In this phase, the charge is transferred to either capacitor 121 or capacitor 122 along one of the two paths. For example, switches 138 and 141 may be closed by signals P2*a* and P2*ad*, respectively while switches 139 and 140 are opened by signals P2*b* and P2*bd* respectively. Thereafter, a charge will be transferred from capacitor 120 to capacitor 122 until control signal P2 goes low. As seen in FIG. 2, control signals P2*a* and P2*b* remain high until the subsequent second phase (i.e., the next time control signal P2 goes high). Accordingly, capacitor 122 and the op amp 110 hold the sampled voltage until the subsequent second phase. While capacitor 122 is holding the sampled signal, capacitor 121 is reset by opening switches 134 and 134 with signals P2*b* and P2*bd*, respectively, and closing switches 135 and 136 with signals P2*a* and P2*ad*, respectively. Accordingly, the voltage across capacitor 121 is returned to a predetermined value based upon the first and second reference voltages. In one embodiment, for example, the charge across the reset capacitor 121 may be approximately zero. In another embodiment, for example, a predetermined charge may be placed on the capacitor during the reset phase. In the subsequent second phase, capacitor 122 is reset and capacitor 121 receives a charge from capacitor 120 and the op amp 110 and capacitor 121 hold the charge until the subsequent second phase.

Figure 3:
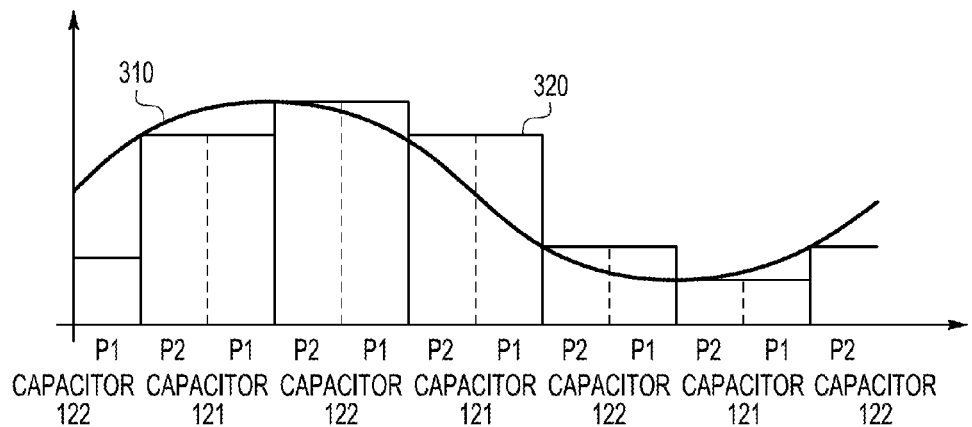
FIG. 3 is a chart illustrating an exemplary input signal and output signal for the sample and hold circuit illustrated in FIG. 1.

FIG. 3 is a graphic illustrating an exemplary input signal 310 and output signal 320 for the circuit 100 illustrated in FIG. 1. In this embodiment, the input signal 310 is a sinusoidal wave. While the sampling rate (e.g., the clock frequency of the master clock illustrated in FIG. 2) is illustrated as being greater than the frequency of the input voltage signal, the input signal 310 can have a frequency greater than the sampling rate. The output signal Vo during the first phase P1 is equal to the output voltage delayed by one-half of a clock cycle (i.e., the input voltage delayed by a full clock cycle). The output voltage during the second phase P2 is equal to the input voltage delayed by one-half clock cycle. In other words, the input voltage is sampled during a first phase and that sampled input voltage is held as the output voltage V0 during the second phase and the following first phase. Accordingly, circuit 100 does not experience a reset where the output voltage drops to zero. Furthermore, as discussed above, the capacitors 121 and 122 alternate holding the output voltage V0, allowing the output of the op amp 110 to settle quickly.

While the capacitors 121 and 122 are alternately reset each full clock cycle, the output Vo of the circuit 100 is not reset since one of the capacitors 121 and 122 holds the sampled voltage during each sampling phase (i.e., the first phase described above). Accordingly, the slew rate requirements for the circuit 100 are reduced since the output of the op amp 110 does not have to reset during each sample phase. Furthermore, because in any given second phase only one of the paths (i.e., one of capacitors 121 and 122) is connected to the op amp 110, a load on the op amp 110 is reduced relative to other non-reset sample and hold circuits which have three capacitors coupled to the operational amplifier during a respective hold phase.

Figure 4:
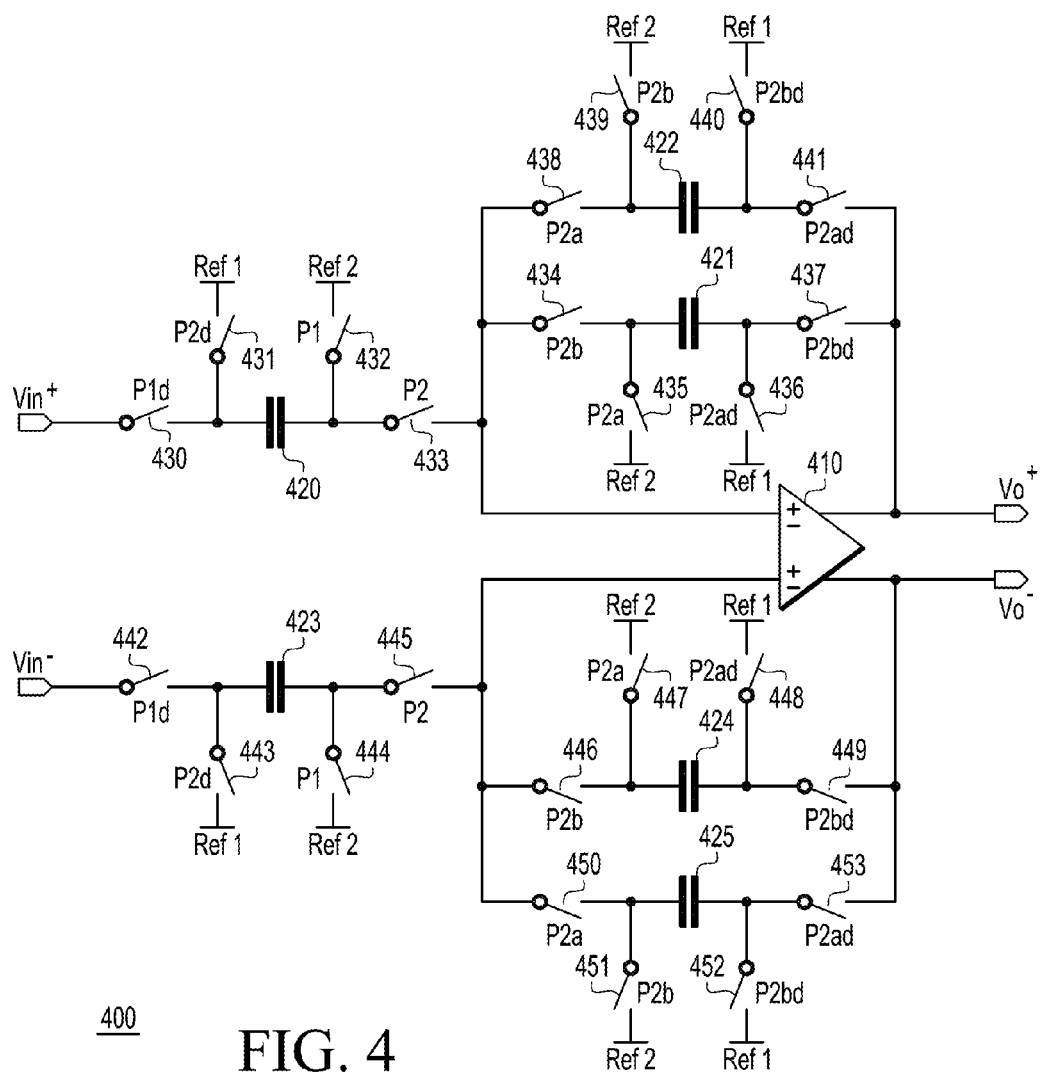
FIG. 4 is a circuit diagram of an exemplary differential sample and hold circuit, in accordance with an embodiment.

FIG. 4 is a circuit diagram of another exemplary sample and hold circuit 400, in accordance with an embodiment. The sample and hold circuit 400 (hereinafter "circuit 400") is a differential sample and hold circuit. The circuit 400 operates similarly to the circuit 100 illustrated in FIG. 1, but samples a differential input analog signal. The circuit 400 includes a differential op amp 410, six capacitors 420-425 and twenty-four switches 430-453.

A first end of switch 430 is configured to receive a first input analog signal Vin'. The switch 431 is coupled between the second end of switch 430 and the first reference voltage. The capacitor 420 is also coupled to the second end of switch 430. The capacitor 420 samples the input analog signal Vin', as discussed in further detail below. The switch 432 is coupled between the second end of the capacitor 420 and the second reference voltage. The switch 433 is coupled between the second end of the capacitor 420 and a first input of the op amp 410. As discussed in further detail below, when the circuit 400 is sampling the input analog signal Vin', switches 430 and 432 will be closed and switches 431 and 433 will be open. Conversely, when the circuit is in a hold mode, switches 431 and 433 will be closed and switches 430 and 432 will be open.

Likewise, a first end of switch 442 is configured to receive a second input analog signal Vin⁻. The switch 443 is coupled between the second end of switch 442 and the first reference voltage. The capacitor 423 is also coupled to the second end of switch 442. The capacitor 423 samples the second input analog signal Vin⁻, as discussed in further detail below. The switch 444 is coupled between the second end of the capacitor 423 and the second reference voltage. The switch 445 is coupled between the second end of the capacitor 423 and a second input of the op amp 410. As discussed in further detail below, when the circuit 400 is sampling the input analog signal, switches 442 and 444 will be closed and switches 443 and 445 will be open. Conversely, when the circuit is in a hold mode, switches 443 and 445 will be closed and switches 442 and 444 will be open.

As seen in FIG. 4, there are two paths between the each input of the op amp 110 and each output of the op amp 410, each of which are connected to an output of the circuit 400. Each path includes four switches and a capacitor. The switches on each path are controlled such that the paths for a respective input/output pair alternate between holding the sampled voltage during a hold period and resetting. In other words, the first path would hold a first sampled voltage while the second path resets. Then, during the subsequent cycle, the second path holds a second sampled voltage while the first path resets.

The first path for the first input/output pair includes a switch 434 coupled to the first input of the op amp 410. A switch 435 is coupled between the second end of switch 434 and the second reference voltage. A capacitor 421 is also coupled to the second end of switch 434. The switch 436 is coupled between the second end of capacitor 421 and the first reference voltage. The switch 437 is coupled between the second end of capacitor 421 and the first output of the op amp 410.

The second path for the first input/output pair includes a switch 438 coupled to the first input of the op amp 410. A switch 439 is coupled between the second end of switch 438 and the second reference voltage. A capacitor 422 is also coupled to the second end of switch 438. The switch 440 is coupled between the second end of capacitor 422 and the first reference voltage. The switch 441 is coupled between the second end of capacitor 422 and the first output of the op amp 410.

The first path for the second input/output pair includes a switch 446 coupled to the second input of the op amp 410. A switch 447 is coupled between the second end of switch 446 and the second reference voltage. A capacitor 424 is also coupled to the second end of switch 446. The switch 448 is coupled between the second end of capacitor 424 and the first reference voltage. The switch 449 is coupled between the second end of capacitor 424 and the second output of the op amp 410.

The second path for the second input/output pair includes a switch 450 coupled to the second input of the op amp 410. A switch 451 is coupled between the second end of switch 450 and the second reference voltage. A capacitor 425 is also coupled to the second end of switch 450. The switch 452 is coupled between the second end of capacitor 425 and the first reference. The switch 453 is coupled between the second end of capacitor 425 and the second output of the op amp 410.

The circuit 400 uses eight control signals to control switches 430-453. The control signals may be generated in any fashion. In one embodiment, for example, the control signals may be generated by one or more clock signals. The one or more clock signals may be delayed, slowed (e.g., divided by two), or a combination thereof to generate the eight control signals. FIG. 2 is a timing diagram illustrating the eight control signals, in accordance with an embodiment. In this embodiment, the eight control signals are P1, P1$d$, P2, P2$d$, P2$a$, P2$ad$, P2$b$ and P2$bd$ are generated based upon a master clock signal. As seen in FIG. 2, control signals P1$d$, P2$d$, P2$ad$ and P2$bd$ are delayed versions of P1, P2, P2$a$ and P2$b$, respectively.

Returning to FIG. 4, in one embodiment switches 430 and 442 receive the control signal P1$d$, switches 431 and 443 receive the control signal P2$d$, switches 432 and 444 receive the P1 control signal, switches 433 and 435 receive the P2 control signal, switches 434, 439, 446 and 451 receive the P2$b$ control signal, switches 435, 438, 447 and 450 receive the P2$a$ control signal, switches 436, 441, 448 and 453 receive the P2$ad$ control signal, and switches 437, 440, 449 and 452 receive the P2$bd$ control signal. As discussed above, the first and second paths for each input/output pair alternate between holding a sampled voltage and resetting. Accordingly, the control signals each path receives can be interchanged.

In a first phase, switches 430 and 442 are closed by control signal P1$d$ and switches 432 and 444 are closed by control signal P1, which allows capacitors 420 and 422 to sample the differential input analog signal. In the circuits second phase, switches 430 and 442 are opened by control signal P1$d$, switches 432 and 444 are opened by control signal P1, switches 431 and 443 are closed by control signal P2$d$ and switches 433 and 445 are closed by control signals P2. In this phase, the charge stored on capacitors 420 is transferred along one of the two paths to capacitor 421 or 422 and the charge stored on capacitors 423 is transferred along one of the two paths to capacitor 424 or 425. For example, switches 438 and 441 may be closed by signals P2$a$ and P2$ad$, respectively. Thereafter, a charge will be transferred from capacitor 420 to capacitor 422 until control signal P2 goes low. Likewise, switches 450 and 453 may be closed by signals P2$a$ and P2$ad$, respectively. Thereafter, a charge will be transferred from capacitor 423 to capacitor 425 until control signal P2 goes low. As seen in FIG. 2, control signals P2$a$ and P2$b$ remain high until the subsequent second phase (i.e., the next time control signal P2 goes high). Accordingly, capacitors 422 and 425 and the op amp 410 hold the sampled voltages until the subsequent second phase. While the capacitors 422 and 425 are holding the sampled signals, capacitors 421 and 424 are reset. In other words, the voltage across capacitor 421 and 424 are returned to a predetermined value based upon the first and second reference voltages. In one embodiment, for example, the charge across the reset capacitors 421 and 424 may be approximately zero. In another embodiment, for example, a predetermined charge may be placed on the capacitor during the reset phase. In the subsequent second phase, capacitors 422 and 425 are reset and capacitors 421 and 424 receives a charge from capacitors 420 and 423, respectively, and the op amp 410 and capacitors 421 and 424 hold the charge until the subsequent second phase.

In one exemplary embodiment, a sample and hold circuit is provided. The sample and hold circuit may include, but is not limited to, a plurality of switches, a first capacitor selectively coupled to a first input signal by at least one of the plurality of switches, an operational amplifier having a first input selectively coupled to the first capacitor by at least one of the plurality of switches, a second input, and a first output, a second capacitor selectively coupled to the first capacitor by at least one of the plurality of switches and selectively coupled between the first input of the operational amplifier and the output of the operational amplifier by at least one of the plurality of switches, a third capacitor selectively coupled to the first capacitor by at least one of the plurality of switches and selectively coupled between the first input of the operational amplifier and the output of the operational amplifier by at least one of the plurality of switches, wherein the plurality of switches are configured to receive a plurality of control signals such that the first capacitor is configured to sample the first input signal in a sample phase, the first capacitor is configured to transfer a charge based on the sampled first input signal to one of the second capacitor and the third capacitor in a hold phase, and the second capacitor and the third capacitor are configured to alternate between holding the transferred charge and resetting in back-to-back hold phases. In one embodiment, for example, the second input is coupled to a first reference voltage. Further, in the hold phase when the first capacitor is coupled to the second capacitor, the third capacitor may be ohmically isolated from the first capacitor and the second capacitor and in the hold phase when the first capacitor is coupled to the third capacitor, the second capacitor may be ohmically isolated from the first capacitor and the third capacitor. In one embodiment, for example, the sample and hold circuit may further include a first switch having a first end and a second end, wherein the first end of the first switch is configured to receive an input signal and the second end of the first switch is coupled to the first end of the first capacitor, a second switch having a first end and a second end, wherein the first end of the second switch is coupled to the second end of the first switch and the second end of the second switch is coupled to a first reference voltage, a third switch having a first end and a second end, wherein the first end of the third switch is coupled to the second end of the first capacitor and the second end of the third switch is coupled to a second reference voltage, and a fourth switch having a first end and a second end, wherein a first end of the fourth switch is coupled to the second end of the first capacitor and the second end of the fourth switch is coupled to the first input of the operation amplifier. In one embodiment, for example, the plurality of switches may further include a fifth switch having a first end and a second end, wherein the first end of the fifth switch is coupled to the second end of the fourth switch and the second end of the fifth switch is coupled to the first end of the second capacitor, a sixth switch having a first end and a second end, wherein the first end of the sixth switch is coupled to the second end of the fifth switch and the second end of the sixth switch is coupled to the second reference voltage, a seventh switch having a first end and a second end, wherein the first end of the seventh switch is coupled to the second end of the second capacitor and the second end of the seventh switch is coupled to the first reference voltage, an eighth switch having a first end and a second end, wherein the first end of the eighth switch is coupled to the second end of the second capacitor and the second end of the eighth switch is coupled to the first output of the operational amplifier, a ninth switch having a first end and a second end, wherein the first end of the ninth switch is coupled to the second end of the fourth switch and the second end of the ninth switch is coupled to the first end of the third capacitor, a tenth switch having a first end and a second end, wherein the first end of the tenth switch is coupled to the second end of the ninth switch and the second end of the tenth switch is coupled to the second reference voltage, an eleventh switch having a first end and a second end, wherein the first end of the eleventh switch is coupled to the second end of the third capacitor and the second end of the eleventh switch is coupled to the first reference voltage, and a twelfth switch having a first end and a second end, wherein the first end of the twelfth switch is coupled to the second end of the third capacitor and the second end of the twelfth switch is coupled to the first output of the operational amplifier. In one embodiment, for example, the first switch is configured receive a first control signal, the second switch is configured receive a second control signal different than the first control signal, the third switch is configured receive a third control signal different than the first control signal and the second control signal, the fourth switch is configured receive a fourth control signal different than the first control signal, the second control signal, and the third control signal, the fifth switch and the tenth switch are configured receive a fifth control signal different than the first control signal, the second control signal, the third control signal, and the fourth control signal, the sixth switch and the ninth switch are configured receive a sixth control signal different than the first control signal, the second control signal, the third control signal, the fourth control signal, and the fifth control signal, the seventh switch and the twelfth switch are configured receive a seventh control signal different than the first control signal, the second control signal, the third control signal, the fourth control signal, the fifth control signal, and the sixth control signal, and the eighth switch and the eleventh switch are configured receive an eighth control signal different than the first control signal, the second control signal, the third control signal, the fourth control signal, the fifth control signal, the sixth control signal, and the seventh control signal. In yet another embodiment, for example, the sample and hold circuit may further include a thirteenth switch having a first end and a second end, wherein the first end of the thirteenth switch is configured to receive a second input signal, a fourteenth switch having a first end and a second end, wherein the first end of the fourteenth switch is coupled to the second end of the thirteenth switch and the second end of the fourteenth switch is coupled to first reference voltage, a fourth capacitor having a first end and a second end, wherein the first end of the fourth capacitor is coupled to the second end of the thirteenth switch, a fifteenth switch having a first end and a second end, wherein the first end of the fifteenth switch is coupled to the second end of the fourth capacitor and the second end of the fifteenth switch is coupled to ground, a sixteenth switch having a first end and a second end, wherein a first end of the sixteenth switch is coupled to the second end of the fourth capacitor and the second end of the sixteenth switch is coupled to a second input of the operational amplifier, a seventeenth switch having a first end and a second end, wherein the first end of the seventeenth switch is coupled to the second end of the sixteenth switch, an eighteenth switch having a first end and a second end, wherein the first end of the eighteenth switch is coupled to the second end of the seventeenth switch and the second end of the eighteenth switch is coupled to the second reference voltage, a fifth capacitor having a first end and a second end, wherein the first end of the fifth capacitor is coupled to the second end of the seventeenth switch, a nineteenth switch having a first end and a second end, wherein the first end of the nineteenth switch is coupled to the second end of the fifth capacitor and the second end of the nineteenth switch is coupled to the first reference voltage, a twentieth switch having a first end and a second end, wherein the first end of the twentieth switch is coupled to the second end of the fifth capacitor and the second end of the twentieth switch is coupled to the second output of the operational amplifier, a twenty-first switch having a first end and a second end, wherein the first end of the twenty-first switch is coupled to the second end of the sixteenth switch, a twenty-second switch having a first end and a second end, wherein the first end of the twenty-second switch is coupled to the second end of the twenty-first switch and the second end of the twenty-second switch is coupled to the second reference voltage, a sixth capacitor having a first end and a second end, wherein the first end of the sixth capacitor is coupled to the second end of the twenty-first switch, an twenty-third switch having a first end and a second end, wherein the first end of the twenty-third switch is coupled to the second end of the sixth capacitor and the second end of the twenty-third switch is coupled to the first reference voltage, and a twenty-fourth switch having a first end and a second end, wherein the first end of the twenty-fourth switch is coupled to the second end of the sixth capacitor and the second end of the twenty-fourth switch is coupled to the second output of the operational amplifier, wherein the first switch and the thirteenth switch are configured receive the first control signal, the second switch and the fourteenth switch are configured receive the second control signal, the third switch and the fifteenth switch are configured receive the third control signal, the fourth switch and the sixteenth switch are configured receive the fourth control signal, the fifth switch, the tenth switch, the seventeenth switch and the twenty-second switch are configured receive the fifth control signal, the sixth switch, the ninth switch, the eighteenth switch and twenty-first switch are configured receive the sixth control signal, the seventh switch, the twelfth switch, the nineteenth switch and the twenty-fourth switch are configured receive the seventh control signal, and the eighth switch, the eleventh switch, the twentieth switch and the twenty-third switch are configured receive the eighth control signal.

In another embodiment, for example, a sample and hold circuit is provided. The sample and hold circuit may include, but is not limited to a first switch having a first end and a second end, wherein the first end of the first switch is configured to receive an input signal, a second switch having a first end and a second end, wherein the first end of the second switch is coupled to the second end of the first switch and the second end of the second switch is coupled to a first reference voltage, a first capacitor having a first end and a second end, wherein the first end of the first capacitor is coupled to the second end of the first switch, a third switch having a first end and a second end, wherein the first end of the third switch is coupled to the second end of the first capacitor and the second end of the third switch is coupled to a second reference voltage, a fourth switch having a first end and a second end, wherein a first end of the fourth switch is coupled to the second end of the first capacitor, an operational amplifier having a first input, a second input, and first output and a second output, wherein the first input is coupled to the second end of the fourth switch, a fifth switch having a first end and a second end, wherein the first end of the fifth switch is coupled to the second end of the fourth switch, a sixth switch having a first end and a second end, wherein the first end of the sixth switch is coupled to the second end of the fifth switch and the second end of the sixth switch is coupled to the second reference voltage, a second capacitor having a first end and a second end, wherein the first end of the second capacitor is coupled to the second end of the fifth switch, a seventh switch having a first end and a second end, wherein the first end of the seventh switch is coupled to the second end of the second capacitor and the second end of the seventh switch is coupled to the first reference voltage, an eighth switch having a first end and a second end, wherein the first end of the eighth switch is coupled to the second end of the second capacitor and the second end of the eighth switch is coupled to the first output of the operational amplifier, a ninth switch having a first end and a second end, wherein the first end of the ninth switch is coupled to the second end of the fourth switch, a tenth switch having a first end and a second end, wherein the first end of the tenth switch is coupled to the second end of the ninth switch and the second end of the tenth switch is coupled to the second reference voltage, a third capacitor having a first end and a second end, wherein the first end of the third capacitor is coupled to the second end of the ninth switch, an eleventh switch having a first end and a second end, wherein the first end of the eleventh switch is coupled to the second end of the third capacitor and the second end of the eleventh switch is coupled to the first reference voltage, and a twelfth switch having a first end and a second end, wherein the first end of the twelfth switch is coupled to the second end of the third capacitor and the second end of the twelfth switch is coupled to the first output of the operational amplifier, wherein the first switch is configured receive a first control signal, the second switch is configured receive a second control signal different than the first control signal, the third switch is configured receive a third control signal different than the first control signal and the second control signal, the fourth switch is configured receive a fourth control signal different than the first control signal, the second control signal, and the third control signal, the fifth switch and the tenth switch are configured receive a fifth control signal different than the first control signal, the second control signal, the third control signal, and the fourth control signal, the sixth switch and the ninth switch are configured receive a sixth control signal different than the first control signal, the second control signal, the third control signal, the fourth control signal, and the fifth control signal, the seventh switch and the twelfth switch are configured receive a seventh control signal different than the first control signal, the second control signal, the third control signal, the fourth control signal, the fifth control signal, and the sixth control signal, and the eighth switch and the eleventh switch are configured receive an eighth control signal different than the first control signal, the second control signal, the third control signal, the fourth control signal, the fifth control signal, the sixth control signal, and the seventh control signal. In one embodiment, for example, the second input of the operation amplifier is coupled to the first reference voltage. In another embodiment, for example, the sample and hold circuit may further include a thirteenth switch having a first end and a second end, wherein the first end of the thirteenth switch is configured to receive a second input signal, a fourteenth switch having a first end and a second end, wherein the first end of the fourteenth switch is coupled to the second end of the thirteenth switch and the second end of the fourteenth switch is coupled to the first reference voltage, a fourth capacitor having a first end and a second end, wherein the first end of the fourth capacitor is coupled to the second end of the thirteenth switch, a fifteenth switch having a first end and a second end, wherein the first end of the fifteenth switch is coupled to the second end of the fourth capacitor and the second end of the fifteenth switch is coupled to the second reference voltage, a sixteenth switch having a first end and a second end, wherein a first end of the sixteenth switch is coupled to the second end of the fourth capacitor and the second end of the sixteenth switch is coupled to the second input of the operational amplifier, a seventeenth switch having a first end and a second end, wherein the first end of the seventeenth switch is coupled to the second end of the sixteenth switch, an eighteenth switch having a first end and a second end, wherein the first end of the eighteenth switch is coupled to the second end of the seventeenth switch and the second end of the eighteenth switch is coupled to the second reference voltage, a fifth capacitor having a first end and a second end, wherein the first end of the fifth capacitor is coupled to the second end of the seventeenth switch, a nineteenth switch having a first end and a second end, wherein the first end of the nineteenth switch is coupled to the second end of the fifth capacitor and the second end of the nineteenth switch is coupled to the first reference voltage, a twentieth switch having a first end and a second end, wherein the first end of the twentieth switch is coupled to the second end of the fifth capacitor and the second end of the twentieth switch is coupled to the second output of the operational amplifier, a twenty-first switch having a first end and a second end, wherein the first end of the twenty-first switch is coupled to the second end of the sixteenth switch, a twenty-second switch having a first end and a second end, wherein the first end of the twenty-second switch is coupled to the second end of the twenty-first switch and the second end of the twenty-second switch is coupled to the second reference voltage, a sixth capacitor having a first end and a second end, wherein the first end of the sixth capacitor is coupled to the second end of the twenty-first switch, an twenty-third switch having a first end and a second end, wherein the first end of the twenty-third switch is coupled to the second end of the sixth capacitor and the second end of the twenty-third switch is coupled to the first reference voltage, and a twenty-fourth switch having a first end and a second end, wherein the first end of the twenty-fourth switch is coupled to the second end of the sixth capacitor and the second end of the twenty-fourth switch is coupled to the second output of the operational amplifier, wherein the first switch and the thirteenth switch are configured receive the first control signal, the second switch and the fourteenth switch are configured receive the second control signal, the third switch and the fifteenth switch are configured receive the third control signal, the fourth switch and the sixteenth switch are configured receive the fourth control signal, the fifth switch, the tenth switch, the seventeenth switch and the twenty-second switch are configured receive the fifth control signal, the sixth switch, the ninth switch, the eighteenth switch and twenty-first switch are configured receive the sixth control signal, the seventh switch, the twelfth switch, the nineteenth switch and the twenty-fourth switch are configured receive the seventh control signal, and the eighth switch, the eleventh switch, the twentieth switch and the twenty-third switch are configured receive the eighth control signal.

In another embodiment, for example, a method for controlling a sample and hold circuit comprising a first capacitor, a second capacitor, a third capacitor, an operational amplifier and a plurality of switches is provided. The method may include, but is not limited to, selectively coupling, in a first phase, via the plurality of switches, the first capacitor to a first input voltage, the second capacitor between a first input to the operational amplifier and a first output of the operational amplifier, and the third capacitor between a first reference voltage and a second reference voltage, and selectively coupling, in a second phase, via the plurality of switches, the first capacitor between the first reference voltage and the first input of the operational amplifier, the third capacitor between the first input of the operational amplifier and the first output of the operational amplifier, and the second capacitor between the first reference voltage and the second reference voltage, wherein in the second phase the second capacitor is ohmically isolated from the first capacitor and the third capacitor. The method may further include selectively coupling, in a subsequent first phase, via the plurality of switches, the first capacitor to the first input voltage, the third capacitor between the first input to the operational amplifier and the first output of the operational amplifier, and the second capacitor between a first reference voltage and a second reference voltage, and selectively coupling, in a subsequent second phase, via the plurality of switches, the first capacitor between the first reference voltage and the first input of the operational amplifier, the second capacitor between the first input of the operational amplifier and the first output of the operational amplifier, and the third capacitor between the first reference voltage and the second reference voltage, wherein in the subsequent second phase, the third capacitor is ohmically isolated from the first capacitor and the second capacitor. In one embodiment, for example, the sample and hold circuit further includes a fourth capacitor, a fifth capacitor, a sixth capacitor and the method may further include selectively coupling, in the first phase, via the plurality of switches, the fourth capacitor to a second input voltage, the fifth capacitor between a second input to the operational amplifier and a second output of the operational amplifier, and the sixth capacitor between a first reference voltage and a second reference voltage, and selectively coupling, in the second phase, via the plurality of switches, the fourth capacitor between the first reference voltage and the second input of the operational amplifier, the sixth capacitor between the second input of the operational amplifier and the second output of the operational amplifier, and the fifth capacitor between the first reference voltage and the second reference voltage. In one embodiment, for example, the method may further include selectively coupling, in the subsequent first phase, via the plurality of switches, the fourth capacitor to the second input voltage, the sixth capacitor between the second input to the operational amplifier and the second output of the operational amplifier, and the fifth capacitor between a first reference voltage and a second reference voltage, and selectively coupling, in the subsequent second phase, via the plurality of switches, the fourth capacitor between the first reference voltage and the second input of the operational amplifier, the fifth capacitor between the second input of the operational amplifier and the second output of the operational amplifier, and the sixth capacitor between the first reference voltage and the second reference voltage.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the embodiments in any way. To the contrary, various changes may be made in the function and arrangement of the various features described herein without departing from the scope of the claims and their legal equivalents.

What is claimed is:

1. A sample and hold circuit, comprising:
a plurality of switches;
a first capacitor selectively coupled to a first input signal by at least one of the plurality of switches;
an operational amplifier having a first input selectively coupled to the first capacitor by at least one of the plurality of switches, a second input, and a first output;
a second capacitor selectively coupled to the first capacitor by at least one of the plurality of switches and selectively coupled between the first input of the operational amplifier and the first output of the operational amplifier by at least one of the plurality of switches;
a third capacitor selectively coupled to the first capacitor by at least one of the plurality of switches and selectively coupled between the first input of the operational amplifier and the first output of the operational amplifier by at least one of the plurality of switches,
wherein the plurality of switches are configured to receive a plurality of control signals such that the first capacitor is configured to sample the first input signal in a sample phase, the first capacitor is configured to transfer a charge based on the sampled first input signal to one of the second capacitor and the third capacitor in a hold phase, and the second capacitor and the third capacitor are configured to alternate between holding the transferred charge and resetting in back-to-back hold phases, wherein in the hold phase when the first capacitor is coupled to the second capacitor, the third capacitor is ohmically isolated from the first capacitor and the second capacitor.

2. The sample and hold circuit of claim 1, wherein the second input is coupled to a first reference voltage.

3. The sample and hold circuit of claim 1, wherein in the hold phase when the first capacitor is coupled to the third capacitor, the second capacitor is ohmically isolated from the first capacitor and the third capacitor.

4. The sample and hold circuit of claim 1, wherein the first capacitor includes a first end and a second end, the second capacitor includes a first end and a second end, and the third capacitor includes a first end and a second end, and the plurality of switches comprise:
- a first switch having a first end and a second end, wherein the first end of the first switch is configured to receive an input signal and the second end of the first switch is coupled to the first end of the first capacitor;
- a second switch having a first end and a second end, wherein the first end of the second switch is coupled to the second end of the first switch and the second end of the second switch is coupled to a first reference voltage;
- a third switch having a first end and a second end, wherein the first end of the third switch is coupled to the second end of the first capacitor and the second end of the third switch is coupled to a second reference voltage; and
- a fourth switch having a first end and a second end, wherein a first end of the fourth switch is coupled to the second end of the first capacitor and the second end of the fourth switch is coupled to the first input of the operation amplifier.

5. The sample and hold circuit of claim 4, wherein the plurality of switches further comprise:
- a fifth switch having a first end and a second end, wherein the first end of the fifth switch is coupled to the second end of the fourth switch and the second end of the fifth switch is coupled to the first end of the second capacitor;
- a sixth switch having a first end and a second end, wherein the first end of the sixth switch is coupled to the second end of the fifth switch and the second end of the sixth switch is coupled to the second reference voltage;
- a seventh switch having a first end and a second end, wherein the first end of the seventh switch is coupled to the second end of the second capacitor and the second end of the seventh switch is coupled to the first reference voltage;
- an eighth switch having a first end and a second end, wherein the first end of the eighth switch is coupled to the second end of the second capacitor and the second end of the eighth switch is coupled to the first output of the operational amplifier;
- a ninth switch having a first end and a second end, wherein the first end of the ninth switch is coupled to the second end of the fourth switch and the second end of the ninth switch is coupled to the first end of the third capacitor;
- a tenth switch having a first end and a second end, wherein the first end of the tenth switch is coupled to the second end of the ninth switch and the second end of the tenth switch is coupled to the second reference voltage;
- an eleventh switch having a first end and a second end, wherein the first end of the eleventh switch is coupled to the second end of the third capacitor and the second end of the eleventh switch is coupled to the first reference voltage; and
- a twelfth switch having a first end and a second end, wherein the first end of the twelfth switch is coupled to the second end of the third capacitor and the second end of the twelfth switch is coupled to the first output of the operational amplifier.

6. The sample and hold circuit of claim 5, wherein the first switch is configured receive a first control signal, the second switch is configured receive a second control signal different than the first control signal, the third switch is configured receive a third control signal different than the first control signal and the second control signal, the fourth switch is configured receive a fourth control signal different than the first control signal, the second control signal, and the third control signal, the fifth switch and the tenth switch are configured receive a fifth control signal different than the first control signal, the second control signal, the third control signal, and the fourth control signal, the sixth switch and the ninth switch are configured receive a sixth control signal different than the first control signal, the second control signal, the third control signal, the fourth control signal, and the fifth control signal, the seventh switch and the twelfth switch are configured receive a seventh control signal different than the first control signal, the second control signal, the third control signal, the fourth control signal, the fifth control signal, and the sixth control signal, and the eighth switch and the eleventh switch are configured receive an eighth control signal different than the first control signal, the second control signal, the third control signal, the fourth control signal, the fifth control signal, the sixth control signal, and the seventh control signal.

7. The sample and hold circuit of claim 6, further comprising:
- a thirteenth switch having a first end and a second end, wherein the first end of the thirteenth switch is configured to receive a second input signal;
- a fourteenth switch having a first end and a second end, wherein the first end of the fourteenth switch is coupled to the second end of the thirteenth switch and the second end of the fourteenth switch is coupled to first reference voltage;
- a fourth capacitor having a first end and a second end, wherein the first end of the fourth capacitor is coupled to the second end of the thirteenth switch;
- a fifteenth switch having a first end and a second end, wherein the first end of the fifteenth switch is coupled to the second end of the fourth capacitor and the second end of the fifteenth switch is coupled to ground;
- a sixteenth switch having a first end and a second end, wherein a first end of the sixteenth switch is coupled to the second end of the fourth capacitor and the second end of the sixteenth switch is coupled to the second input of the operational amplifier;
- a seventeenth switch having a first end and a second end, wherein the first end of the seventeenth switch is coupled to the second end of the sixteenth switch;
- an eighteenth switch having a first end and a second end, wherein the first end of the eighteenth switch is coupled to the second end of the seventeenth switch and the second end of the eighteenth switch is coupled to the second reference voltage;
- a fifth capacitor having a first end and a second end, wherein the first end of the fifth capacitor is coupled to the second end of the seventeenth switch;
- a nineteenth switch having a first end and a second end, wherein the first end of the nineteenth switch is coupled to the second end of the fifth capacitor and the second end of the nineteenth switch is coupled to the first reference voltage;

a twentieth switch having a first end and a second end, wherein the first end of the twentieth switch is coupled to the second end of the fifth capacitor and the second end of the twentieth switch is coupled to a second output of the operational amplifier;

a twenty-first switch having a first end and a second end, wherein the first end of the twenty-first switch is coupled to the second end of the sixteenth switch;

a twenty-second switch having a first end and a second end, wherein the first end of the twenty-second switch is coupled to the second end of the twenty-first switch and the second end of the twenty-second switch is coupled to the second reference voltage;

a sixth capacitor having a first end and a second end, wherein the first end of the sixth capacitor is coupled to the second end of the twenty-first switch;

a twenty-third switch having a first end and a second end, wherein the first end of the twenty-third switch is coupled to the second end of the sixth capacitor and the second end of the twenty-third switch is coupled to the first reference voltage; and a twenty-fourth switch having a first end and a second end, wherein the first end of the twenty-fourth switch is coupled to the second end of the sixth capacitor and the second end of the twenty-fourth switch is coupled to the second output of the operational amplifier.

8. The sample and hold circuit of claim 7, wherein the first switch and the thirteenth switch are configured receive the first control signal, the second switch and the fourteenth switch are configured receive the second control signal, the third switch and the fifteenth switch are configured receive the third control signal, the fourth switch and the sixteenth switch are configured receive the fourth control signal, the fifth switch, the tenth switch, the seventeenth switch and the twenty-second switch are configured receive the fifth control signal, the sixth switch, the ninth switch, the eighteenth switch and twenty-first switch are configured receive the sixth control signal, the seventh switch, the twelfth switch, the nineteenth switch and the twenty-fourth switch are configured receive the seventh control signal, and the eighth switch, the eleventh switch, the twentieth switch and the twenty-third switch are configured receive the eighth control signal.

9. A sample and hold circuit, comprising:
a first switch having a first end and a second end, wherein the first end of the first switch is configured to receive an input signal;

a second switch having a first end and a second end, wherein the first end of the second switch is coupled to the second end of the first switch and the second end of the second switch is coupled to a first reference voltage;

a first capacitor having a first end and a second end, wherein the first end of the first capacitor is coupled to the second end of the first switch;

a third switch having a first end and a second end, wherein the first end of the third switch is coupled to the second end of the first capacitor and the second end of the third switch is coupled to a second reference voltage;

a fourth switch having a first end and a second end, wherein a first end of the fourth switch is coupled to the second end of the first capacitor;

an operational amplifier having a first input, a second input, and first output and a second output, wherein the first input is coupled to the second end of the fourth switch;

a fifth switch having a first end and a second end, wherein the first end of the fifth switch is coupled to the second end of the fourth switch;

a sixth switch having a first end and a second end, wherein the first end of the sixth switch is coupled to the second end of the fifth switch and the second end of the sixth switch is coupled to the second reference voltage;

a second capacitor having a first end and a second end, wherein the first end of the second capacitor is coupled to the second end of the fifth switch;

a seventh switch having a first end and a second end, wherein the first end of the seventh switch is coupled to the second end of the second capacitor and the second end of the seventh switch is coupled to the first reference voltage;

an eighth switch having a first end and a second end, wherein the first end of the eighth switch is coupled to the second end of the second capacitor and the second end of the eighth switch is coupled to the first output of the operational amplifier;

a ninth switch having a first end and a second end, wherein the first end of the ninth switch is coupled to the second end of the fourth switch;

a tenth switch having a first end and a second end, wherein the first end of the tenth switch is coupled to the second end of the ninth switch and the second end of the tenth switch is coupled to the second reference voltage;

a third capacitor having a first end and a second end, wherein the first end of the third capacitor is coupled to the second end of the ninth switch;

an eleventh switch having a first end and a second end, wherein the first end of the eleventh switch is coupled to the second end of the third capacitor and the second end of the eleventh switch is coupled to the first reference voltage; and a twelfth switch having a first end and a second end, wherein the first end of the twelfth switch is coupled to the second end of the third capacitor and the second end of the twelfth switch is coupled to the first output of the operational amplifier.

10. The sample and hold circuit of claim 9, wherein the first switch is configured receive a first control signal, the second switch is configured receive a second control signal different than the first control signal, the third switch is configured receive a third control signal different than the first control signal and the second control signal, the fourth switch is configured receive a fourth control signal different than the first control signal, the second control signal, and the third control signal, the fifth switch and the tenth switch are configured receive a fifth control signal different than the first control signal, the second control signal, the third control signal, and the fourth control signal, the sixth switch and the ninth switch are configured receive a sixth control signal different than the first control signal, the second control signal, the third control signal, the fourth control signal, and the fifth control signal, the seventh switch and the twelfth switch are configured receive a seventh control signal different than the first control signal, the second control signal, the third control signal, the fourth control signal, the fifth control signal, and the sixth control signal, and the eighth switch and the eleventh switch are configured receive an eighth control signal different than the first control signal, the second control signal, the third control signal, the fourth control signal, the fifth control signal, the sixth control signal, and the seventh control signal.

11. The sample and hold circuit of claim 9, wherein the second input of the operation amplifier is coupled to the first reference voltage.

12. The sample and hold circuit of claim 9, further comprising:

a thirteenth switch having a first end and a second end, wherein the first end of the thirteenth switch is configured to receive a second input signal;

a fourteenth switch having a first end and a second end, wherein the first end of the fourteenth switch is coupled to the second end of the thirteenth switch and the second end of the fourteenth switch is coupled to the first reference voltage;

a fourth capacitor having a first end and a second end, wherein the first end of the fourth capacitor is coupled to the second end of the thirteenth switch;

a fifteenth switch having a first end and a second end, wherein the first end of the fifteenth switch is coupled to the second end of the fourth capacitor and the second end of the fifteenth switch is coupled to the second reference voltage;

a sixteenth switch having a first end and a second end, wherein a first end of the sixteenth switch is coupled to the second end of the fourth capacitor and the second end of the sixteenth switch is coupled to the second input of the operational amplifier;

a seventeenth switch having a first end and a second end, wherein the first end of the seventeenth switch is coupled to the second end of the sixteenth switch;

an eighteenth switch having a first end and a second end, wherein the first end of the eighteenth switch is coupled to the second end of the seventeenth switch and the second end of the eighteenth switch is coupled to the second reference voltage;

a fifth capacitor having a first end and a second end, wherein the first end of the fifth capacitor is coupled to the second end of the seventeenth switch;

a nineteenth switch having a first end and a second end, wherein the first end of the nineteenth switch is coupled to the second end of the fifth capacitor and the second end of the nineteenth switch is coupled to the first reference voltage;

a twentieth switch having a first end and a second end, wherein the first end of the twentieth switch is coupled to the second end of the fifth capacitor and the second end of the twentieth switch is coupled to the second output of the operational amplifier;

a twenty-first switch having a first end and a second end, wherein the first end of the twenty-first switch is coupled to the second end of the sixteenth switch;

a twenty-second switch having a first end and a second end, wherein the first end of the twenty-second switch is coupled to the second end of the twenty-first switch and the second end of the twenty-second switch is coupled to the second reference voltage;

a sixth capacitor having a first end and a second end, wherein the first end of the sixth capacitor is coupled to the second end of the twenty-first switch;

a twenty-third switch having a first end and a second end, wherein the first end of the twenty-third switch is coupled to the second end of the sixth capacitor and the second end of the twenty-third switch is coupled to the first reference voltage; and a twenty-fourth switch having a first end and a second end, wherein the first end of the twenty-fourth switch is coupled to the second end of the sixth capacitor and the second end of the twenty-fourth switch is coupled to the second output of the operational amplifier.

13. The sample and hold circuit of claim 12, wherein the first switch and the thirteenth switch are configured receive the first control signal, the second switch and the fourteenth switch are configured receive the second control signal, the third switch and the fifteenth switch are configured receive the third control signal, the fourth switch and the sixteenth switch are configured receive the fourth control signal, the fifth switch, the tenth switch, the seventeenth switch and the twenty-second switch are configured receive the fifth control signal, the sixth switch, the ninth switch, the eighteenth switch and twenty-first switch are configured receive the sixth control signal, the seventh switch, the twelfth switch, the nineteenth switch and the twenty-fourth switch are configured receive the seventh control signal, and the eighth switch, the eleventh switch, the twentieth switch and the twenty-third switch are configured receive the eighth control signal.

14. A method for controlling a sample and hold circuit comprising a first capacitor, a second capacitor, a third capacitor, an operational amplifier and a plurality of switches, the method comprising:

selectively coupling, in a first phase, via the plurality of switches, the first capacitor to a first input voltage, the second capacitor between a first input to the operational amplifier and a first output of the operational amplifier, and the third capacitor between a first reference voltage and a second reference voltage; and selectively coupling, in a second phase, via the plurality of switches, the first capacitor between the first reference voltage and the first input of the operational amplifier, the third capacitor between the first input of the operational amplifier and the first output of the operational amplifier, and the second capacitor between the first reference voltage and the second reference voltage.

15. The method of claim 14, wherein in the second phase the second capacitor is ohmically isolated from the first capacitor and the third capacitor.

16. The method of claim 14, further comprising selectively coupling, in a subsequent first phase, via the plurality of switches, the first capacitor to the first input voltage, the third capacitor between the first input to the operational amplifier and the first output of the operational amplifier, and the second capacitor between the first reference voltage and the second reference voltage; and selectively coupling, in a subsequent second phase, via the plurality of switches, the first capacitor between the first reference voltage and the first input of the operational amplifier, the second capacitor between the first input of the operational amplifier and the first output of the operational amplifier, and the third capacitor between the first reference voltage and the second reference voltage.

17. The sample and hold circuit of claim 16, wherein in the subsequent second phase, the third capacitor is ohmically isolated from the first capacitor and the second capacitor.

18. The method of claim 14, wherein the sample and hold circuit further comprises a fourth capacitor, a fifth capacitor, a sixth capacitor, the method further comprising:

selectively coupling, in the first phase, via the plurality of switches, the fourth capacitor to a second input voltage, the fifth capacitor between a second input to the operational amplifier and a second output of the operational amplifier, and the sixth capacitor between a first reference voltage and a second reference voltage; and selectively coupling, in the second phase, via the plurality of switches, the fourth capacitor between the first reference voltage and the second input of the operational amplifier, the sixth capacitor between the second input of the operational amplifier and the second output of the operational amplifier, and the fifth capacitor between the first reference voltage and the second reference voltage.

19. The method of claim 18, further comprising
selectively coupling, in the subsequent first phase, via the plurality of switches, the fourth capacitor to the second input voltage, the sixth capacitor between the second input to the operational amplifier and the second output of the operational amplifier, and the fifth capacitor between a first reference voltage and a second reference voltage; and selectively coupling, in the subsequent second phase, via the plurality of switches, the fourth capacitor between the first reference voltage and the second input of the operational amplifier, the fifth capacitor between the second input of the operational amplifier and the second output of the operational amplifier, and the sixth capacitor between the first reference voltage and the second reference voltage.

* * * * *